United States Patent [19]

Jenkinson et al.

[11] Patent Number: 5,272,007

[45] Date of Patent: Dec. 21, 1993

[54] SOLDER POWDER COATED WITH PARYLENE

[75] Inventors: Richard D. Jenkinson, Fort Meyer, Fla.; Michael W. Sowa, Indianapolis, Ind.

[73] Assignee: Union Carbide Chemicals & Plastics Technology Corporation, Danbury, Conn.

[21] Appl. No.: 839,581

[22] Filed: Feb. 21, 1992

[51] Int. Cl.$^5$ .................... B32B 15/08; B32B 15/16
[52] U.S. Cl. .................... 428/403; 228/56.3; 228/223; 228/224; 428/407
[58] Field of Search ............... 428/403, 407; 528/496; 228/56.3, 223, 224

[56] References Cited

U.S. PATENT DOCUMENTS

| | | | |
|---|---|---|---|
| 3,300,332 | 1/1967 | Gorham et al. | 428/402.24 |
| 4,225,647 | 9/1980 | Parent | 528/396 |
| 4,298,407 | 11/1981 | Taylor | 148/24 |
| 4,380,518 | 4/1983 | Wydro | 264/13 |
| 4,419,279 | 12/1983 | Abrams | 252/514 |
| 4,758,288 | 7/1988 | Versic | 428/407 |
| 4,818,614 | 4/1989 | Fukui et al. | 428/403 |
| 4,994,326 | 2/1991 | Takashi et al. | 428/405 |
| 5,069,972 | 12/1991 | Versic | 428/407 |

FOREIGN PATENT DOCUMENTS 0449016 3/1991 Fed. Rep. of Germany .

Primary Examiner—P. C. Sluby
Assistant Examiner—D. S. Nakarani
Attorney, Agent, or Firm—W. K. Volles

[57] ABSTRACT

Solder powders coated with a thin layer of parylene and solder pastes containing the coated solder powders are disclosed. The coated solder powders can exhibit a high degree of resistance to oxidation and to reaction with the flux contained in the solder paste without substantially interfering with the reflow characteristics of the solder.

8 Claims, No Drawings

SOLDER POWDER COATED WITH PARYLENE

FIELD OF THE INVENTION

The present invention relates to solder powders coated with a protective coating. More specifically, the present invention relates to solder powders coated with parylene in order to inhibit oxidation of the solder powder and reaction of the solder powder with the flux in solder paste without substantially inhibiting the reflow characteristics of the solder.

BACKGROUND OF THE INVENTION

In the electronics industry, electrical components such as resistors, capacitors, inductors, transistors, integrated circuits, chip carriers and the like, are typically mounted on circuit boards in one of two ways. In one way, the components are mounted on one side of the board and the leads from the components extend through the board and are soldered to the circuit on the opposite side of the board. In the other way, the components are mounted and soldered on the same side as the circuit, i.e. surface-mounted.

Solder-paste is commonly used for surface-mounted soldering of electrical components to circuit boards. Solder paste is useful because it can be applied to selected areas of the circuit board and can be readily adapted to automation. Its tacky characteristic provides the capability of holding the electrical components in position without additional adhesives before forming the permanent bonds by soldering.

Solder paste typically comprises a solder powder, a resinous component such as rosin, activators such as organic acids or amines, thixotropic agents and solvents. The solder paste is typically coated on the circuit board by means of screen printing, dispensing, transfer printing and the like. Thereafter, the electrical components are placed on the circuit board and the solder paste is reflowed. The term "reflow", as used herein, means heating the solder sufficiently to cause it to melt and thereafter cooling the solder sufficiently to cause it to solidify.

One problem in the industry associated with the use of solder paste is that it often has a short and unpredictable shelf life, e.g., typically from about one month to six months. The unpredictability in shelf life is caused, at least in part, by variations in the lag time from when the solder powder is made to the time it is mixed with flux to form solder paste, thereby resulting in variations in the degree of oxidation on the solder powder. Such oxidized powder does not reflow as well as unoxidized powder and tends to agglomerate and form solder balls. Furthermore, when the solder powder is combined with flux, which is corrosive, the solder powder often reacts with the flux, thereby further oxidizing the powder and reducing the acidity of the flux. As a result, the solder paste often becomes less effective with time. Moreover, the reaction between the solder powder and the flux typically causes the viscosity of the solder paste to increase substantially, which can make printing of the solder paste difficult or impossible.

Attempts have been made to reduce the reaction rate between the solder powder and the flux and thereby increases the shelf life of the solder paste, by storing the solder paste under refrigeration conditions. However, refrigeration is not effective to compensate for the varying degrees of oxidation on the solder powder prior to its incorporation into the solder paste.

It has also been proposed to coat the solder powder with materials that are non-reactive with the solder paste. For example, U.S. Pat. No. 4,994,326, issued Feb. 19, 1991, discloses at column 4, lines 44 to 50;

The coating agents to be used are insoluble or hardly soluble in a vehicle for solder pastes to be described later, and may include those based on silicone and fluorine such as, for instance, silicone oils, silicone base high-molecular compounds, fluorinated silicone oils, fluorosilicone resins and fluorinated hydrocarbon base high-molecular compounds.

The patent also discloses a relatively large amount of coating material which is applied to the solder powder. For instance, at column 5, lines 44 to 47, it is stated:

When a carbon-containing compound is used as the coating agent, a quantitative analysis value for carbon is preferably 30 to 70 mol %.

According to the above-referenced patent, the relatively large amount of coating material may be effective to inhibit oxidation of the solder powder. However, in general, large amounts of coating material are undesirable since they can create a barrier which can inhibit the reflow of the solder. Moreover, such large amounts of coating material may cause physical obstructions and/or impurities which result in poor reflow characteristics. In general, poor reflow characteristics are evidenced by the formation of solder balls and by the inadequate wetting of the substrate by the flux which can cause poor spreading of the solder and a discontinuous solder connection.

In addition, the above-referenced patent discloses the use of fluorinated hydrocarbons which are used as solvents in coating the solder powder. Currently, fluorinated hydrocarbons are considered to be an environmental pollutant and the use thereof is generally undesirable.

In view of the problems described above, improved coatings for solder powders are desired which can inhibit oxidation without substantially inhibiting the reflow characteristics of the solder. In addition, coated solder powders which do not require the use of fluorinated hydrocarbons as solvents to apply the coating materials to the solder powders are desired.

SUMMARY OF THE INVENTION

By the present invention, solder powders coated with parylene are provided which can inhibit oxidation of the solder powder without substantially inhibiting the reflow characteristics of the solder. In addition, the coated solder powders of the present invention do not require the use of fluorinated hydrocarbons as solvents to apply the coating material to the solder powder.

DETAILED DESCRIPTION OF THE INVENTION

Quite surprisingly, it has been found that parylene is an excellent coating material for solder powders due to its ability to form extremely thin conformal coatings. Parylene is a generic term often used to describe a class of poly-p-xylylenes.

Various forms of parylene are commercially available for example, from Union Carbide Corporation, Danbury, Conn. The following structures represent some commercially available parylene dimers.

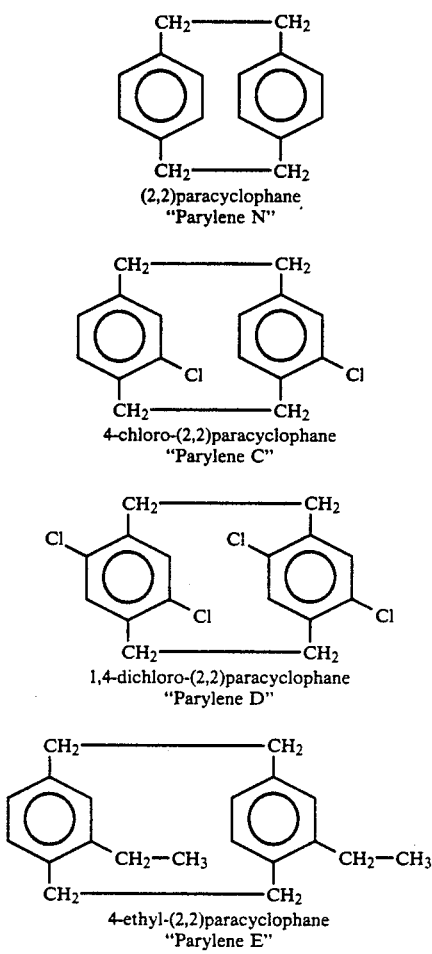

(2,2)paracyclophane
"Parylene N"

4-chloro-(2,2)paracyclophane
"Parylene C"

1,4-dichloro-(2,2)paracyclophane
"Parylene D"

4-ethyl-(2,2)paracyclophane
"Parylene E"

Preferred forms of parylene are those which melt below the melting point of the particular solder alloy used in the solder powder. When common tin-lead solder alloys are used, e.g., 63 weight % tin, 37 weight % lead, Parylene E is a preferred form of parylene for use in accordance with the present invention is because it melts below the melting point of the solder, i.e., about 180° C. Those skilled in the art will recognize that any form of parylene (including forms not specifically disclosed herein), or combinations thereof, can be appropriately selected to correspond to the melting point of the particular solder alloy in question.

In accordance with the present invention, parylene is applied to the solder powder by a vapor deposition process, known as the "parylene process", wherein the parylene monomer is condensed and polymerized directly on the article to be coated. Since the parylene monomer is not stable, the parylene dimers, as illustrated above, are used as the starting material. The parylene process begins with the vaporization of the parylene dimer. The dimer is pyrolytically cleaved at temperatures of about 400° to 750° to form a reactive parylene monomer vapor. Thereafter, the reactive monomer vapor is transferred to a deposition chamber wherein the substrates are located. Within the deposition chamber, the reactive monomer vapor condenses upon the substrates to form the parylene polymer or co-polymer film. For coating small articles, e.g., solder powder, it is preferred to place the articles in a rotatable tumbler mounter inside the deposition chamber.

Any monomer vapor which fails to condense within the deposition chamber is subsequently removed, usually by a cold trap which is maintained at cryogenic temperatures.

The entire parylene process is generally carried out in a closed system under constant negative pressure. Such closed system may incorporate separate chambers for the (a) vaporization, (b) pyrolysis, and (c) deposition steps of the process, with such chambers being connected by way of appropriate plumbing or tubular connections.

Specific details concerning the parylene process and apparatus for carrying out the process are known by those skilled in the art.

The particular type of solder used in accordance with the present invention is not critical. Typically, the solders will be comprised of at least two of the following metals; tin, lead, silver, bismuth, indium, antimony, and cadmium. Tin-lead solder alloys are commonly used in concentration ranges from about 50 to 70 weight percent tin and about 30 to 50 weight percent lead.

Solder powder suitable for use in accordance with the present invention can be prepared by conventional means, e.g., melting and atomizing the solder to form solder powder. Due to the ability of parylene to conform to varied geometric shapes, both amorphous and spherical solder powder particles are suitable for use in accordance with the present invention. The particle size of the solder particles is not critical to the present invention. Typically, the particle size will be less than 100 mesh. Fine powders will often have an average particle size of from about 20 microns to 325 mesh. Coarse powders will often have an average particle size of from about 200 to 400 mesh. The term "average particle size", as used herein, means that less than 2 weight percent of the particles will be larger than the specified size and less than 5 weight percent of the particles will be smaller than the specified size. The mesh values correspond to the U.S. Standard Sieve Series and Tyler Equivalents, Table 21-12, CHEMICAL ENGINEERS HANDBOOK, Perry and Chilton, 5th Edition, McGraw-Hill Book Company.

In accordance with the present invention parylene is applied to the solder powder in an amount effective to inhibit oxidation. It has been found that as little as 0.001 wt. percent is effective to inhibit oxidation. It has also been found that at such low coating levels a portion of any individual solder particle may not be coated. When the coated solder powder of the present invention is used in a solder paste, it is preferred that the effective amount does not substantially inhibit the reflow characteristics of the solder. In general, good reflow characteristics are evidenced by solder which coalesces on reflow and does not form an excessive amount of solder balls. Good reflow characteristics are also evidenced by flux which causes adequate wetting to provide continuous spreading of the solder and continuity of the solder joints. Preferably, the effective amount of parylene coating is less than about 0.5 weight percent based on the total weight of the coated solder powder. More preferably, the coated solder powder will contain from about 0.001 to about 0.2 weight percent parylene based on the total weight of the coated solder powder. Even more preferably, the coated solder powder will contain from about 0.005 to about 0.05 weight percent parylene and most preferably from about 0.005 to about 0.025 weight percent parylene based on the total weight of the coated solder powder.

The coated solder powders of the present invention are suitable for use in solder pastes which can be prepared by combining the coated solder powder with a flux. Typically, the flux will comprise at least one of the following ingredients: a rosin such as gum rosin, wood rosin, or tall oil rosin; derivatives of rosins such as dimerized resin or rosin derived ester resin; an organic acid which can be an aliphatic acid or aromatic acid; an amine such as an aliphatic amine, or a halide salt of an amine; and a solvent such as an alcohol, glycol, ester, ketone, aromatic solvent, and the like. The solder paste of the present invention may also contain other ingredients such as, for example, rheological control agents and suspending agents. The selection of specific flux ingredients, and their proportions, is known to those skilled in the art.

The coated solder powder is preferably combined with the flux in order to evenly disperse the solder powder in the flux, e.g., by mixing. Typically, the solder powder will be combined with the flux to form a paste comprising from about 5 to 20 weight percent flux, often about 10 weight percent flux with the balance being the coated solder powder. Techniques for combining solder powders with flux to form solder paste are known by those skilled in the art.

The viscosity of the solder paste provides a good indication of the printability of the paste. High viscosities can create printing difficulties. Typically, the viscosity of the solder pastes made with the coated solder powder of the present invention is less than about $1.5 \times 10^6$ centipoise ("cp") at 25° C. Often, the viscosity will range from about 80,000 to about $1.5 \times 10^6$ cp. Other common ranges for viscosity are 300,000 to 400,000 cp; 600,000 to 900,000 cp; and $1.0 \times 10^6$ to $1.3 \times 10^6$ cp.

Quite surprisingly, it has been found that solder pastes made with the coated solder powder of the present invention can retain their viscosity without any substantial increase, i.e., typically less then a thirty percent increase, often less then a twenty percent increase, over long periods of time on a consistent basis from batch to batch. This is believed to be due to the uniformity of the parylene conformal coating. As a result, solder pastes made with the coated solder powder of the present invention will typically have a shelf life greater than 6 months, often greater than 1 year.

The following examples are provided for illustrative purposes and are not intended to limit the scope of the claims which follow.

EXAMPLE I

Coating of Solder Particles

A vapor deposition apparatus with a tumbler mounted horizontally within the deposition chamber was used to coat solder powder with various amounts of Parylene E. The tumbler was set to rotate at about 50 to 60 revolutions per minute. Solder powder alloy (63 weight percent tin, 37 weight percent lead), in the weights listed below in Table 1 was placed in the tumbler. The deposition chamber was evacuated to a pressure level of about 10 to 15 millitorr. Parylene E, in the weights listed below in Table 1, was placed in the vaporizer section of the apparatus and heated to about 150° C. The pyrolyis section was maintained at about 690° C. The heat input to the vaporizer section was maintained at a level sufficient to allow the pressure in the deposition chamber to increase to about 40 to 50 millitorr. This pressure level was maintained until the supply of Parylene E dimer was exhausted. It was estimated that about 50 to 80 weight percent of the parylene deposited on the solder powder and the balance deposited on the walls of the tumbler, i.e., the coating efficiency was about 50 to 80 percent.

TABLE I

| Sample No. | Powder Weight (grams) | Parylene E Dimer (grams) | Wt % Parylene E (at 50% coating efficiency) |
| --- | --- | --- | --- |
| 1-1 | 1042 | 2.084 | 0.100 |
| 1-2 | 1344 | 1.344 | 0.050 |
| 1-3 | 1344 | 1.008 | 0.038 |
| 1-4 | 1344 | 0.672 | 0.025 |
| 1-5 | 1344 | 0.4032 | 0.015 |
| 1-6 | 1344 | 0.2688 | 0.010 |
| 1-7 | 1344 | 0.1344 | 0.005 |

EXAMPLE II

Formulation of Solder Pastes

Coated solder powders similar to those described in Example 1 are combined with flux to form solder pastes. The compositions of the solder pastes are listed in Table 2 below. The coated solder powders have resistance to oxidation and reaction with the flux in the pastes. All of the flux ingredients are readily commercially available.

TABLE II

| Ingredient | Weight Percent |
| --- | --- |
| Paste 1 | |
| Coated Solder Powder | 90.0 |
| Dimerized Resin | 3.5 |
| Lauric Acid | 1.0 |
| Triethanol Amine | 0.5 |
| 2-methyl-1-butanol | 4.5 |
| Hydrogenated Castor Oil | 0.5 |
| Paste 2 | |
| Coated Solder Powder | 90.0 |
| Polyethylene Glycol | 4.0 |
| 2-methyl-1-butanol | 4.8 |
| Betaine hydrochloric acid | 0.5 |
| Ethyl cellulose | 0.5 |
| Hydrochloric acid | 0.2 |
| Paste 3 | |
| Coated Solder Powder | 90.0 |
| Rosin Derived Ester Resin | 4.0 |
| Terpineol | 2.0 |
| 2-methyl-1-butanol | 2.0 |
| Lauric Acid | 0.5 |
| Monoethanol amine | 0.5 |
| Hydrogenated Castor Oil | 1.0 |

We claim:

1. A coated solder powder comprising solder particles coated with parylene in an amount of from about 0.001 to about 0.2 weight percent based on the total weight of the coated solder powder and effective to inhibit oxidation of the solder particles without substantially inhibiting reflow characteristics of the coated solder powder, said parylene having a melting point lower than said solder particles.

2. A coated solder powder according to claim 1 wherein the effective amount of parylene is from about 0.005 to about 0.05 weight percent based on the total weight of the coated solder powder.

3. A coated solder powder according to claim 2 wherein the effective amount of parylene is from about 0.005 to about 0.025 weight percent based on the total weight of the coated solder powder.

4. A coated solder powder according to claim 1 wherein the solder particles have an average particle size of from about 200 to about 400 mesh.

5. A coated solder powder according to claim 1 wherein the solder particles have an average particle size of from about 20 microns to about 325 mesh.

6. A coated solder powder according to claim 1 wherein the parylene has a melting point of less than about 180° C.

7. A coated solder powder according to claim 1 wherein the parylene coating is polymerized from a dimer having the following structure

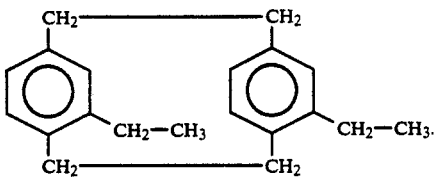

8. A coated solder powder for use in a solder paste, said coated solder powder comprising solder particles containing tin and lead coated with from about 0.005 to about 0.05 weight percent of parylene which is polymerized from a dimer having the following structure

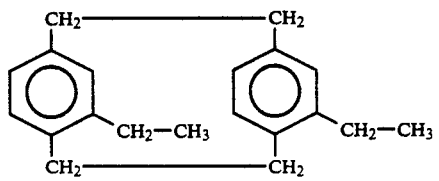

wherein the parylene has a melting point of less than about 180° C.

* * * * *